United States Patent [19]

Tomizawa et al.

[11] Patent Number: 4,933,553

[45] Date of Patent: Jun. 12, 1990

[54] FOCUSING APPARATUS OF ELECTRON MICROSCOPE

[75] Inventors: Junichiro Tomizawa; Susumu Ozasa, both of Katsuta, Japan

[73] Assignees: Hitachi, Ltd., Tokyo; Hitachi Naka Seiki, Ltd., Ibaraki, both of Japan

[21] Appl. No.: 319,670

[22] Filed: Mar. 7, 1989

[30] Foreign Application Priority Data

Mar. 9, 1988 [JP] Japan .................................. 63-53823

[51] Int. Cl.$^5$ .............................................. H01V 37/21
[52] U.S. Cl. ..................................... 250/310; 250/397
[58] Field of Search ................... 250/310, 307, 396 R, 250/397; 313/442, 443

[56] References Cited

U.S. PATENT DOCUMENTS

4,214,163  7/1980  Namae et al. ........................ 250/311
4,675,528  6/1987  Langner et al. ..................... 250/307

Primary Examiner—Jack I. Berman
Attorney, Agent, or Firm—Antonelli, Terry, Stout & Kraus

[57] ABSTRACT

A focusing apparatus of electron microscope for focusing an electron beam through a focusing lens onto a sample, having a deflecting means for making the electron beam scan on the sample, an astigmatism correcting means of the electron beam, a detecting means for detecting the 2nd electrons from the sample when the sample is scanned by the electron beam, and an optimum exciting current determining means of the focusing lens. The optimum exciting current is obtained by determining the position of the centroid of an area surrounded by a curve Y=f (I) and a fixed straight line. The curve Y shows the relationship between the exciting current for the focusing lens and an electron beam radius corresponding signal which is obtained on the basis of a signal from the detecting means and inversely corresponds to a radius of the electron beam on the surface of the sample.

The focusing apparatus enable the exact and simple determination of the optimum exciting current for the focusing lens corresponding to the circle of least confusion.

16 Claims, 5 Drawing Sheets

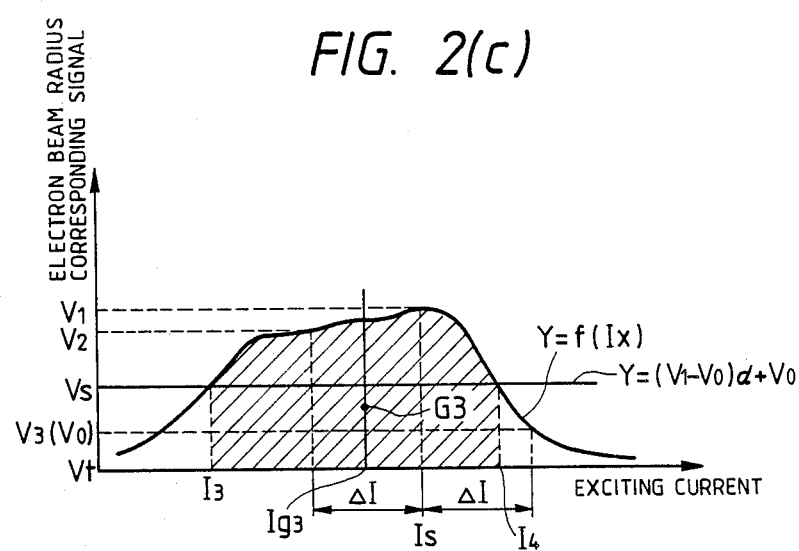
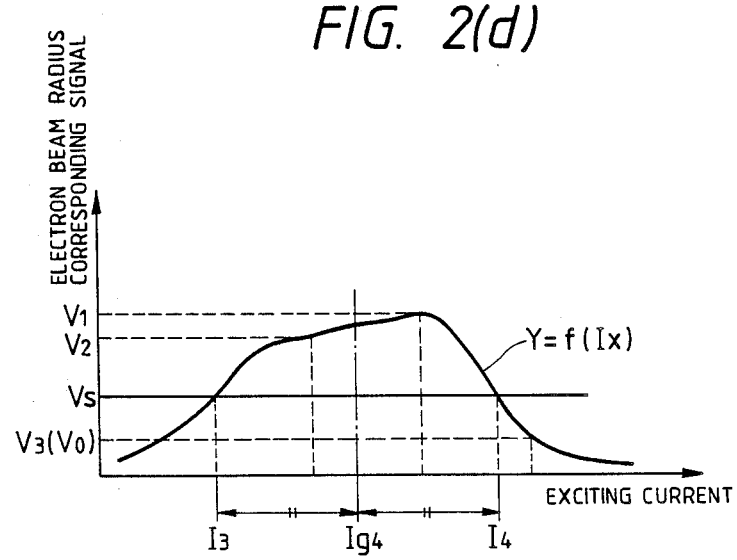

FOCUSING APPARATUS OF ELECTRON MICROSCOPE

BACKGROUND OF THE INVENTION

The present invention relates to a focusing apparatus of an electron microscope and more particularly to a focusing apparatus of an electron microscope which conducts the correction of astigmatism automatically.

Regarding a usual apparatus of focusing as the preceding stage of correction of astigmatism in the electron microscope wherein the correction of astigmatism is conducted automatically, i.e., a apparatus of determining a circle of least confusion, a description is made in U.S. Pat. No. 4,214,163 according to which the circle of least confusion is determined by the following procedures.

(1) An electron beam is made to scan in the direction X on a sample, a signal inversely corresponding to the radius of the electron beam is obtained in each scan, and an exciting current $I_1$, for a focusing lens whereby the signal is turned to be maximum is determined.

(2) The electron beam is made to scan in the direction Y on the sample, a signal inversely corresponding to the radius of the electron beam is obtained in the same way as the above, and an exciting current $I_2$ for the focusing lens whereby the signal is turned to be maximum is determined.

(3) The mean value $(I_1+I_2)/2$ is calculated from aforesaid exciting currents $I_1$ and $I_2$ for the focusing lens, and the exciting current for the focusing lens is set at his mean value $(I_1+I_2)/2$.

By the apparatus described above, the circle of the electron beam focused on the sample becomes the circle of least confusion. The position of this circle of least confusion is equivalent to the position of a focus obtained when the astigmatism is corrected.

In the prior art, as described above, the electron beam is made to scan is each of the directions X and Y, the exciting current for the focusing lens whereby a variation component of a current of a secondary electron or the like generated from the sample on the occasion is turned to be maximum is determined in each scan, and the exciting current for the focusing lens at the time when the circle of least confusion is formed is determined from the mean value of the exciting currents thus determined. The variation component of the secondary electron current is generated by a shape or a pattern on the surface of the sample.

According to this apparatus, however, there occurs a problem that the exciting current for the focusing lens corresponding to the circle of least confusion can not be determined exactly when the shape or pattern on the surface of the sample is non-isotropic as in a small part of IC pattern, for example.

FIG. 3 shows the relationship between the focusing lens exciting current applied when an electron beam is made to scan on the sample in each of the directions X and Y with the current varied and an electron beam radius corresponding signal at this time.

By the way, the electron beam radius corresponding signal means a signal inversely corresponding to the radius of the electron beam and is obtained as a variation component of the current of secondary electrons generated from the sample. The more the electron beam is focused on the sample, the bigger the electron beam radius corresponding signal becomes.

This figure shows particularly a case ((b) of the FIG. 3) wherein the maximum value being an extremely large point is not obtained when scanning is conducted in the direction Y, since the variation component of the shape or pattern on the surface of the sample is small, while the maximum value $I_1$, being the extremely large point is obtained ((a) of the FIG. 3) when the scanning is conducted in the direction X.

In the case when the shape of the surface on the sample is non-isotropic and therefore the maximum value being the extremely large point does not appear distinctly, as described above, the aforesaid exciting currents $I_1$ and $I_2$ can not be determined exactly according to the prior art, and consequently it is very difficult to exactly determine the exciting current for the focusing lens corresponding to the circle of least confusion.

While the apparatus of scanning wherein the electron beam is made to scan in the direction X and Y separately is described in the above-described example, two extremely large points are obtained as shown in FIG. 5(a) even when the electron beam is made to scan circularly, on condition that the shape of the sample is isotropic, and therefore the exciting current for the focusing lens corresponding to the circle of least confusion can be determined exactly by taking the mean value of said points. When the shape of the sample is non-isotropic, however, the two extremely large points can not be obtained as shown in FIG. 5(b) for the focusing lens corresponding to the circle of least confusion can be determined exactly.

SUMMARY OF THE INVENTION

An object of the present invention is to furnish a focusing apparatus of an electron microscope which enables the solution of the above-described problem and the exact and simple determination of the exciting current for the focusing lens corresponding to the circle of least confusion.

In a scanning electron microscope wherein the correction of astigmatism is conducted automatically, the above-stated object is attained by providing a detecting means to detect an information generated from a specimen by scanning the specimen with an electron beam, and by determining a focusing lens optimum exciting current which is determined from the position of the centroid of an area surrounded by a curve of the electron beam radius corresponding signal showing the relationship between the exciting current for the focusing lens and the electron beam radius corresponding signal and by a prescribed straight line.

Moreover, said object is attained by determining a current as an approximate value of the aforesaid focusing lens optimum exciting current which is determined from the position of the center of two intersecting points of the curve of the electron beam radius corresponding signal showing the relationship between the exciting current for the focusing lens and the electron beam radius corresponding signal and of a prescribed straight line.

BRIEF DESCRIPTION OF THE DRAWINGS

FIGS. 2(a), 2(b), 2(c) and 2(d) are graphs for illustrating the principle of focusing in the scanning electron microscope to which the present invention is applied.

DETAILED DESCRIPTION OF THE PREFERRED EMBODIMENTS

An embodiment of the present invention will be described hereunder by using drawings.

Figure 1:
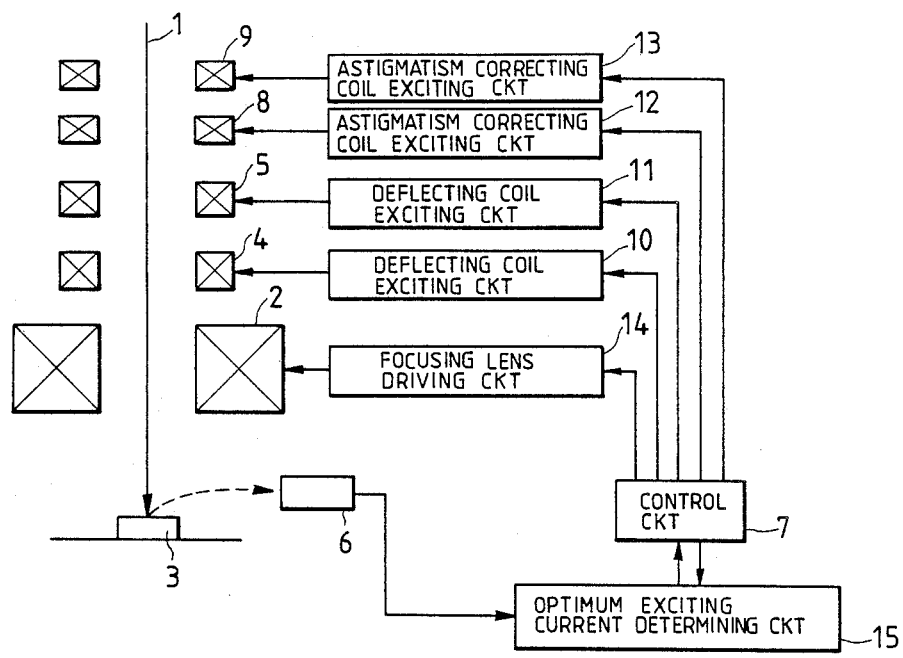
FIG. 1 is a simplified block diagram showing the principal structural elements of a scanning electron microscope to which the present invention is applied.

FIG. 1 is a simplified block diagram showing the principal structural elements of a scanning electron microscope to which the present invention is applied.

In the figure, numeral 1 denotes an electron beam, which is focused finely on a sample 3 by a focusing lens 2. Numeral 14 denotes a focusing lens driving circuit for driving the focusing lens 2, and it is connected to a control circuit 7 which will be described later.

4 and 5 denote deflecting coils for making the aforesaid electron beam scan in the directions X and Y, respectively, and 10 and 11 deflecting coil exciting circuits for driving said deflecting coils 4 and 5 respectively.

Both of said deflecting coil exciting circuits 10 and 11 are connected to the control circuit 7.

8 and 9 denote X-direction and Y-direction astigmatism correcting coils respectively, and 12 and 13 astigmatism correcting coil exciting circuits for driving said astigmatism correcting coils 8 and 9 respectively.

Both of said astigmatism correcting coil exciting circuits 12 and 13 are connected to the control circuit 7.

Numeral 6 denotes a detector detecting a signal of a secondary electron or the like generated form the sample 3 by the application of the aforesaid electron beam, and the detector is connected to a focusing lens optimum exciting current determining circuit 15.

The focusing lens optimum exciting current determining circuit 15 sets an exciting current for the focusing lens corresponding to a circle of least confusion of the basis of an output signal from the aforesaid detector 6, and outputs a set value to the control circuit 7.

The control circuit 7 controls the aforesaid focusing lens driving circuit 14, the deflecting coil exciting circuits 10 and 11 and the astigmatism correcting coil exciting circuits 12 and 13.

In the scanning electron microscope which has the above-stated construction and to which the present invention is applied, the aforesaid electron beam 1 is made to scan circularly on the sample 3 by varying an exciting current for the deflecting coils 4 and 5. The detector 6 detects an image signal of a secondary electron, a thermoelectron, an absorption electron or the like generated from the sample 3 and outputs the image signal to the focusing lens optimum exciting current determining circuit 15.

Said focusing lens optimum exciting current determining circuit 15 converts the aforesaid image signal into a signal corresponding to the spot radius of the electron beam 1.

Herein, an integral value of a variation of the image signal generated from the detector 6 is used as the signal corresponding to the spot radius of the aforesaid electron beam 1.

The image signal delivered from the aforesaid detector 6 shows a sharper variation as the thickness of the electron beam 1 in the scanning direction (in the tangential direction in the case of circular scanning) on the sample 3 becomes smaller, and therefore the image signal on the occasion contains a large amount of variation component. This means, as a consequence, that, when the variation component of the aforesaid image signal is taken out as the signal corresponding to spot radius of the electron beam 1 and only a varied part of said variation component is integrated for each one scanning, the thickness of the spot radius of the electron beam 1 in the scanning direction becomes smaller as the integral value obtained by the integration (hereinafter called an electron beam radius corresponding signal) becomes larger.

The aforesaid focusing lens optimum exciting current determining circuit 15 determines the relationship between the intensity of current supplied to the focusing lens driving circuit 14 and the signal corresponding to the electron beam on the occasion, determines a focusing lens exciting current corresponding to the circle of least confusion from this relationship and outputs same to the control circuit 7.

While generating the focusing lens exciting current corresponding to the aforesaid circle of least confusion to the focusing lens driving circuit 14, the control circuit 7 controls the deflecting coil exciting circuits 10, 11 and the astigmatism correcting coil exciting circuits 12, 13.

A method of determining the focusing lens exciting current corresponding to the circle of least confusion by the scanning electron microscope of the present invention will be described in detail hereunder by using FIG. 2.

This figure shows the relationship between the integral value of the electron beam radius corresponding signal and an exciting current for the focusing lens driving circuit 14 on the occasion when the electron beam is made to scan circularly on the sample, showing particularly the case when the two extreme large points do not appear distinctly since the shape of the sample is nonisotropic.

In the case when the two extreme large points do not appear distinctly as the above, it is very difficult to determine exactly the exciting current for the focusing lens corresponding to the circle of least confusion, according to the prior art.

Figure 2A:
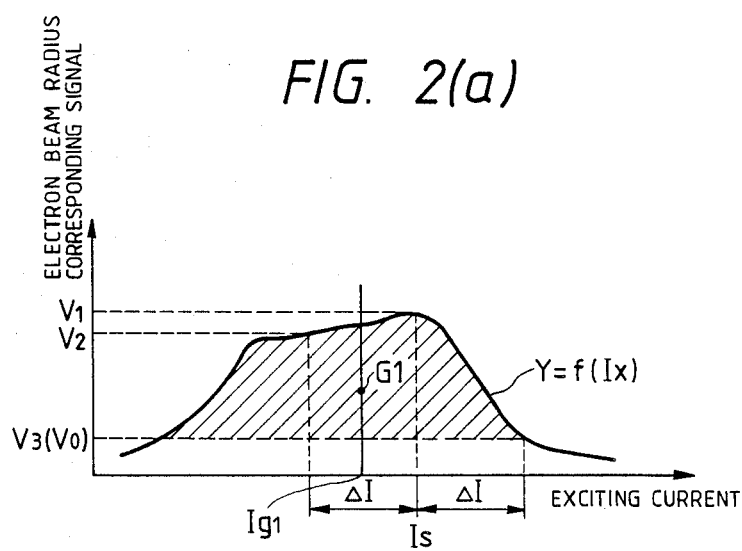

FIG. 2(a) is a graph for illustrating a focusing operation according to one embodiment of the present invention.

First, the relationship between the electron beam radius corresponding signal obtained from the variation of the secondary electron emitted from the specimen in each circular scan of said electron beam on the specimen and the exciting current for the focusing lens on the occasion, is determined.

For simplification of description, the aforesaid relationship is represented herein as a curve $Y = f(I_x)$.

Subsequently, an exciting current $I_s$ for the focusing lens corresponding to the maximum value $V_1$ being the extreme large point of said curve $Y = f(I_x)$ is determined, further electron beam radius corresponding signals $V_3 = f(I_s + \Delta I)$ and $V_2 = f(I_s - \Delta I)$ obtained when an increase and a decrease are made by a certain value $\Delta I$ from said exciting current $I_s$ as the center value are determined, and the minimum value of these signals is set as $V_0 \cdot V_0 = V_3$ in the present embodiment, since $V_2 > V_3$.

While the electron beam radius corresponding signals $V_2$ and $V_3$ are described as determined by making the increase and decrease by the equal amount $\Delta I$ from the focusing lens exciting current $I_s$ corresponding to the maximum value $V_1$, which is set as the center value, values of the increase and decrease are not necessarily equal, but they may be arbitrary values respectively on condition that said exciting current $I_s$ be made to exist within the limits of these increase and decrease.

Successively, the centroid $G_1$ of a region (a hatched part) surrounded by a straight line $Y = V_0$ and the aforesaid curve $Y = f(I_x)$ is determined. Then an exciting current $I_{gl}$ for the focusing, lens corresponding to said position of the centroid $G_1$ is the exciting current corresponding to the circle of least confusion.

The above-mentioned centroid $G_1$ can be determined by a proper method known publicly (also in other embodiments to be described in the following).

Figure 2B:
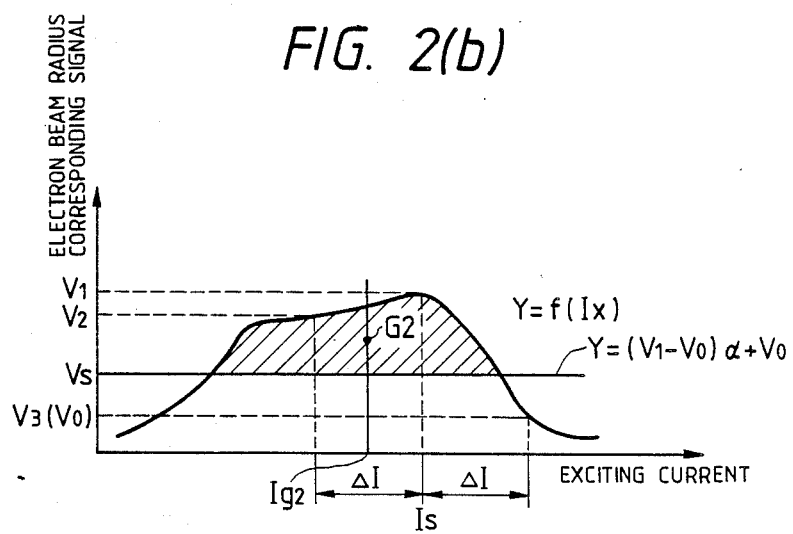
Figure 3A:
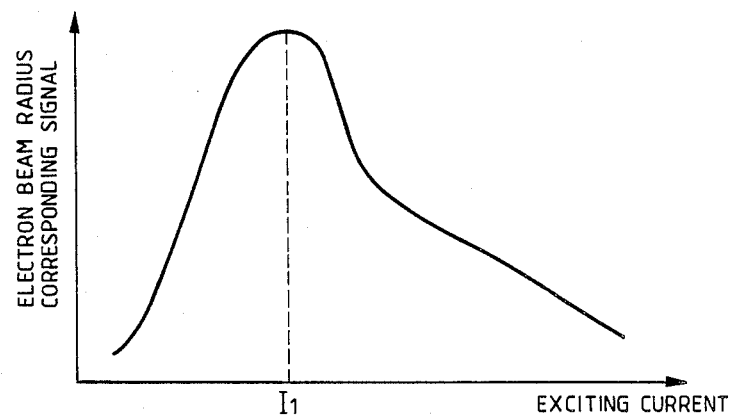
FIGS. 3(a), 3(b), 5(a) and 5(b) are graphs showing the relationship between a focusing lens exciting current and an electron beam radius corresponding signal.
Figure 3B:
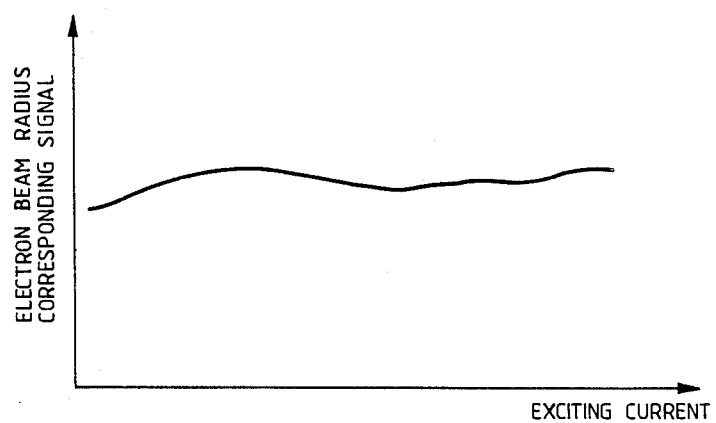
Figure 5A:
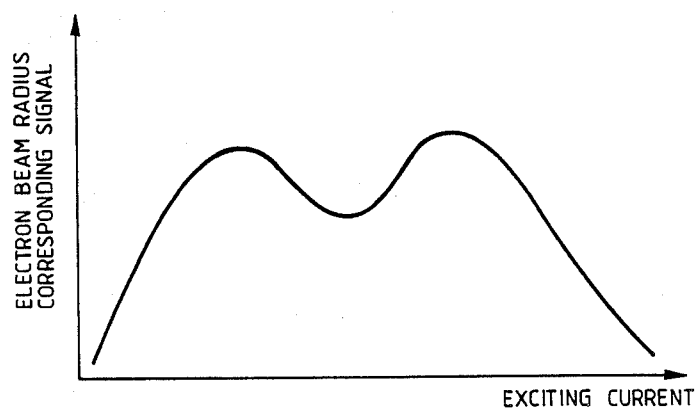
Figure 5B:
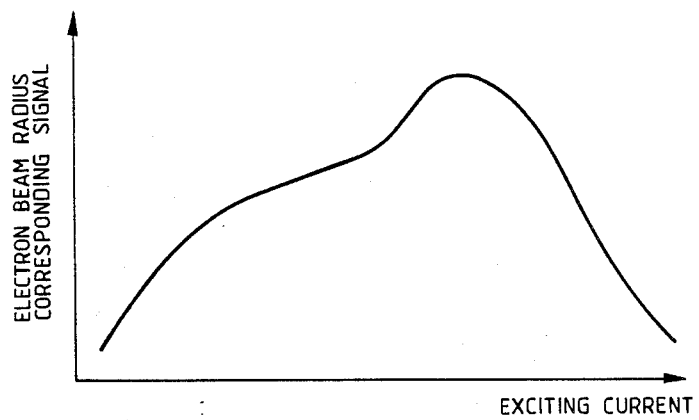

Another embodiment of the present invention will be described hereunder by using FIG. 2(b).

After the minimum value $V_0$ is determined in the same way as in the above-described case of FIG. 2(a), an electron beam radius corresponding signal $$V_s = (V_1 - V_0)\alpha + V_0$$

is determined from the aforesaid extreme large point $V_1$ and the minimum value $V_0$, and the centroid $G_2$ of a region (a hatched part) surrounded by a straight line $Y = V_s$ and the aforesaid curve $Y = f(I_x)$ is determined. The inventor of the present invention confirmed that it is desirable, on the occasion, that the value $\alpha$ is set within the limits of 0.1 to 0.5 and an exciting current $I_{g2}$ for the focusing lens corresponding to the position of said centroid $G_2$ is the exciting current corresponding to the circle of least confusion.

A still another embodiment of the present invention will be described hereunder by using FIG. 2(c).

After the straight line $V_s = (V_1 - V_0)\alpha = V_0$ is determined in the same way as in the above-described figure (b), intersecting points of the straight line $Y = V_s$ and the aforesaid curve $Y = f(I_x)$ are denoted by $I_3$ and $I_4$ respectively, and the centroid of region (a hatched part) surrounded by a straight line $X = I_3$, a straight line $X = I_4$ and a straight line $Y = V_t$ parallel to the X axis and $0 < V_t < V_s$ is denoted by $G_3$. An exciting current $I_{g3}$ for the focusing lens corresponding to the position of said centroid $G_3$, thus obtained, may also be used as the exciting current corresponding to the circle of least confusion.

The present embodiment of FIG. 2(c) shows the case when $V_t$ is set to be equal to 0.

Besides, as an approximate value of the aforesaid gravity, the middle point of the aforesaid intersecting points $I_3$ and $I_4$ may be taken also for an exciting current $I_{g4}$ for the focusing lens corresponding to the circle of least confusion, as shown in FIG. 2(d).

Figure 4:
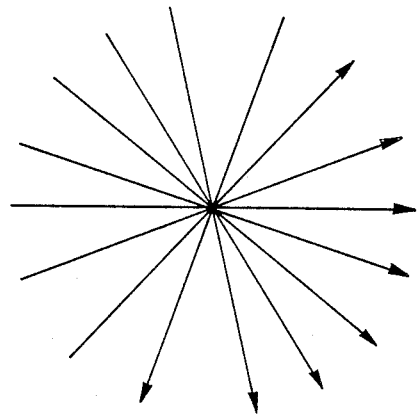
FIG. 4 is a schematic view of tracks of scanning in the case when an electron beam is made to scan in arbitrary directions.

Although the case when the circular scanning is taken as the scanning method of the electron beam is cited in the foregoing description, the present invention is not limited thereto, and an ordinary method of scanning in the directions X and Y, scanning in the shape of a closed loop, or scanning of the electron beam in a number of arbitrary directions as shown in FIG. 4, may be adopted as well. The aforesaid curve of the electron beam radius corresponding signal is determined from the mean value of electron beam radius corresponding signals obtained on the occasion, and thereafter the exciting current for the focusing lens corresponding to the circle of least confusion is determined in the same way as in the foregoing embodiments.

In other words, any method of scanning may be adopted, provided that the focusing apparatus of an electron microscope is employed wherein the exciting current for the focusing lens is determined from the position of the centroid of an area surrounded by the curve of the electron beam radius corresponding signal corresponding to the exciting current for the focusing lens obtained when the electron beam is made to scan with said exciting current varied, and by a prescribed straight line, or from the intersecting points of the curve and the line.

When the exciting current for the focusing lens corresponding to the circle of least confusion is determined as described above, the control circuit 7 fixes at this exciting current the intensity of current supplied to the focusing lens driving circuit 14 and then executes the so-called correction of astigmatism to further lessen the radius of the aforesaid circle of least confusion.

It is clear that the application of the above-described present invention to the correction of astigmatism enables the exact and simple correction of astigmatism, compared with the prior-art case.

Moreover, the repetition of the focusing operation of the focusing lens and the correction of astigmatism described above enables the implementation of further exact focusing.

Although only the case when the present invention is applied to the scanning electron microscope is mentioned in the above description, the present invention is not limited thereto, but can be applied also to transmission electron microscope apparatuses, provided that a means to make the electron beam scan in one direction at least is attained thereto.

According to the present invention, as described above, it is possible to furnish the focusing apparatus of an electron microscope which enables the exact and simple determination of the exciting current for the focusing lens corresponding to the circle of least confusion in the stage of the focusing operation conducted before the operation of correction of astigmatism even when the shape of a sample is non-isotropic and when the maximum value being the extreme large value of the curve of the electron beam radius corresponding signal does not appear distinctly.

We claim:

1. A focusing apparatus of an electron microscope which has a focusing lens for focusing an electron beam onto a sample,
   a deflecting means for making the electron beam scan on the sample,
   an astigmatism correcting means disposed in the vicinity of the passage of the electron beam,
   a detecting means to detect a signal generated from the sample when the sample is scanned by the electron beam, and
   an optimum exciting current determining means to determine an optimum exciting current for the focusing lens on the basis of an output signal from the detecting means, and wherein
   the aforesaid optimum exciting current determining means determines an optimum exciting current for the focusing lens from an exciting current which corresponds to the position of the centroid of an area surrounded by a curve represented by a formula $Y = f(I)$, wherein I is the exciting current for the focusing lens and Y is an electron beam radius corresponding signal which is obtained on the basis of a signal from the detecting means and inversely corresponds to a radius of the electron beam and a fixed straight line of the electron beam radius corresponding signal.

2. A focusing apparatus of an electron microscope according to claim 1, wherein the aforesaid fixed straight line of the electron beam radius corresponding signal is a straight line represented by a formula $Y=Y_{min}$, wherein a focusing lens exciting current corresponding to the maximum value $Y_{max}$ of the aforesaid curve of the electron beam radius corresponding signal is denoted by $I_s$ and variations from $I_s$ are denoted by $\Delta I_p$ and $\Delta I_m$, and when values represented by $f(I_s+\Delta I_p)$ and $f(I_s-\Delta I_m)$ are compared with each other, the not larger one of them is denoted by $Y_{min}$.

3. A focusing apparatus of an electron microscope according to claim 2, wherein $\Delta I_p$ equals to $\Delta I_m$.

4. A focusing apparatus of an electron microscope according to claim 1, wherein the aforesaid fixed straight line of the electron beam radius corresponding signal is a straight line represented by a formula $Y=(Y_{max}-Y_{min})\alpha+Y_{min}$, wherein the focusing lens exciting current corresponding to the maximum value $Y_{max}$ of the aforesaid curve of the electron beam radius corresponding signal is denoted by $I_s$ and variations from $I_s$ are denoted by $\Delta I_p$ and $\Delta I_m$, and when the values of $f(I_s+\Delta I_p)$ and $f(I_s-\Delta I_m)$ are compared with each other, the not larger one of them is denoted by $Y_{min}$.

5. A focusing apparatus of an electron microscope according to claim 4, wherein $\Delta I_p$ equals to $\Delta I_m$.

6. A focusing apparatus of an electron microscope according to claim 3, wherein the aforesaid $\alpha$ is $0.1 \leq \leq 0.5$.

7. A focusing apparatus of an electron microscope according to claim 6, wherein $\Delta I_p$ equals to $\Delta I_m$.

8. A focusing apparatus of an electron microscope according to claim 1, wherein the aforesaid optimum exciting current determining means for the focusing lens determines, as the optimum exciting current for the focusing lens, an exciting current which corresponds to the position of the centroid of an area surrounded by the curve represented by the formula $Y=f(I)$ of the electron beam radius corresponding signal showing the relationship between the exciting current for the focusing lens and the electron beam radius corresponding signal, by a fixed straight line represented by $Y=C$ of the electron beam radius corresponding signal and by a fixed straight line of the focusing lens exciting current.

9. A focusing apparatus of an electron microscope according claim 8, wherein the aforesaid value C is defined as $0 \leq C < (Y_{max}-Y_{min})\alpha+Y_{min}$.

10. A focusing apparatus of an electron microscope according claim 9, wherein the aforesaid value $\alpha$ is defined as $0.1 \leq \alpha \leq 0.5$.

11. A focusing apparatus of an electron microscope according to claim 8, wherein the aforesaid fixed straight line of the focusing lens exciting current comprises a straight line represented by a formula $X=I_n$ and a straight line represented by a formula $X=I_m$, wherein the focusing lens exciting current corresponding to the maximum value $Y_{max}$ of the aforesaid curve of the electron beam radius corresponding signal is denoted by $I_s$, when the values represented by $f(I_s+\Delta I_p)$ and $f(I_s-\Delta I_m)$ are compared with each other and the not larger one of them is denoted by $Y_{min}$ and when focusing lens exciting currents corresponding to two intersecting points of the curve represented by the formula $Y=f(I)$ of the electron beam radius corresponding signal and the straight line represented by the formula $Y=(Y_{max}-Y_{min})\alpha+Y_{min}$ are denoted by $I_n$ and $I_m$ respectively.

12. A focusing apparatus of the electron microscope according to claim 11, wherein the aforesaid value $\alpha$ is defined as $0.1 \leq \alpha \leq 0.5$.

13. A focusing apparatus of the electron microscope according to claim 1, wherein the aforesaid position of the centroid is approximated by the position of the center of two intersecting points of the curve represented by the formula $Y=f(I)$ and the fixed straight line.

14. A focusing apparatus of an electron microscope according to claim 10, wherein the aforesaid fixed straight line of the electron beam radius corresponding signal is represented by a formula $Y=(Y_{max}-Y_{min})\alpha+Y_{min}$ when the focusing lens exciting current corresponding to the maximum value $Y_{max}$ of the aforesaid curve of the electron beam radius corresponding signal is denoted by $I_s$ and when the values represented by $f(I_s+\Delta I_p)$ and $f(I_s-\Delta I_m)$ are compared with each other and the not larger one of them is denoted by $Y_{min}$.

15. A focusing apparatus of an electron beam according to claim 14, wherein the aforesaid value $\alpha$ is defined as $0.1 \leq \alpha \leq 0.5$.

16. A focusing apparatus of an electron microscope according to claim 14, wherein $\Delta I_p$ equals to $\Delta I_m$.

* * * * *